United States Patent
Huang

(10) Patent No.: US 8,017,971 B2
(45) Date of Patent: Sep. 13, 2011

(54) LIGHT EMITTING DIODE LIGHT SOURCE

(75) Inventor: Shan-Fu Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 214 days.

(21) Appl. No.: 12/431,658

(22) Filed: Apr. 28, 2009

(65) Prior Publication Data
US 2009/0315052 A1    Dec. 24, 2009

(30) Foreign Application Priority Data
Jun. 19, 2008  (CN) .......................... 2008 1 0302225

(51) Int. Cl.
*H01L 33/00* (2010.01)

(52) U.S. Cl. .................... 257/99; 257/98; 257/E33.061; 257/E33.067

(58) Field of Classification Search ............. 257/98–99; 362/97.1; 313/498
See application file for complete search history.

(56) References Cited

U.S. PATENT DOCUMENTS

| | | | | |
|---|---|---|---|---|
| 3,774,021 | A * | 11/1973 | Johnson | 362/27 |
| 6,361,190 | B1 * | 3/2002 | McDermott | 362/310 |
| 2004/0119668 | A1 * | 6/2004 | Homma et al. | 345/82 |
| 2004/0207999 | A1 * | 10/2004 | Suehiro et al. | 362/84 |
| 2006/0119250 | A1 * | 6/2006 | Suehiro et al. | 313/498 |
| 2006/0196944 | A1 * | 9/2006 | Maeda et al. | 235/462.42 |
| 2009/0242919 | A1 * | 10/2009 | Lin et al. | 257/98 |

FOREIGN PATENT DOCUMENTS

CN    1504803    6/2004
CN    1586017    2/2005

* cited by examiner

Primary Examiner — A. Sefer
(74) Attorney, Agent, or Firm — Altis Law Group, Inc.

(57) ABSTRACT

An LED light source includes an LED die and a transparent encapsulation. The LED die includes a die emitting surface. The transparent encapsulation includes a reflective surface and an encapsulation emitting surface. The LED die is encapsulated by the transparent encapsulation such that the die emitting surface faces the encapsulation emitting surface. The transparent encapsulation is generally convex albeit having a concave recessed portion. The recessed portion is aligned with the die emitting surface and shaped so as to increase an effect of total internal reflection of light rays generated by the light emitting diode die and incident thereon.

4 Claims, 5 Drawing Sheets

LIGHT EMITTING DIODE LIGHT SOURCE

BACKGROUND

1. Technical Field

The present disclosure relates to light emitting diode (LED) light sources and a backlight having an LED light source. The backlight can typically be used in a liquid crystal display (LCD).

2. Description of Related Art

In general, an LED light source includes an LED die. The LED die includes an emitting surface. Due to the high refractive index of most LED materials (typically greater than 3), light rays generated in the LED die incident on the emitting surface at an angle greater about 20 degrees experience total internal reflection (TIR) and do not pass through the emitting surface. This limitation makes the LED die a highly directional light source. To improve the directional property of the LED die and also to protect the LED die from being damaged, the LED light source also includes a dome-shaped encapsulation. The LED die is encapsulated by the dome-shaped encapsulation. One of the shortcomings of such a dome-shaped encapsulation in an LED light source is that the dome-shaped encapsulation typically does not significantly change (i.e., spread) the light intensity distribution of the LED die. As a result, the uniformity of light output by the LED light source is rather low, and may not adequately meet performance requirements when the LED light source is applied to a backlight of an LCD.

Therefore, it is desirable to provide an LED light source and a backlight which can overcome the above-mentioned problems.

DETAILED DESCRIPTION

Figure 1:
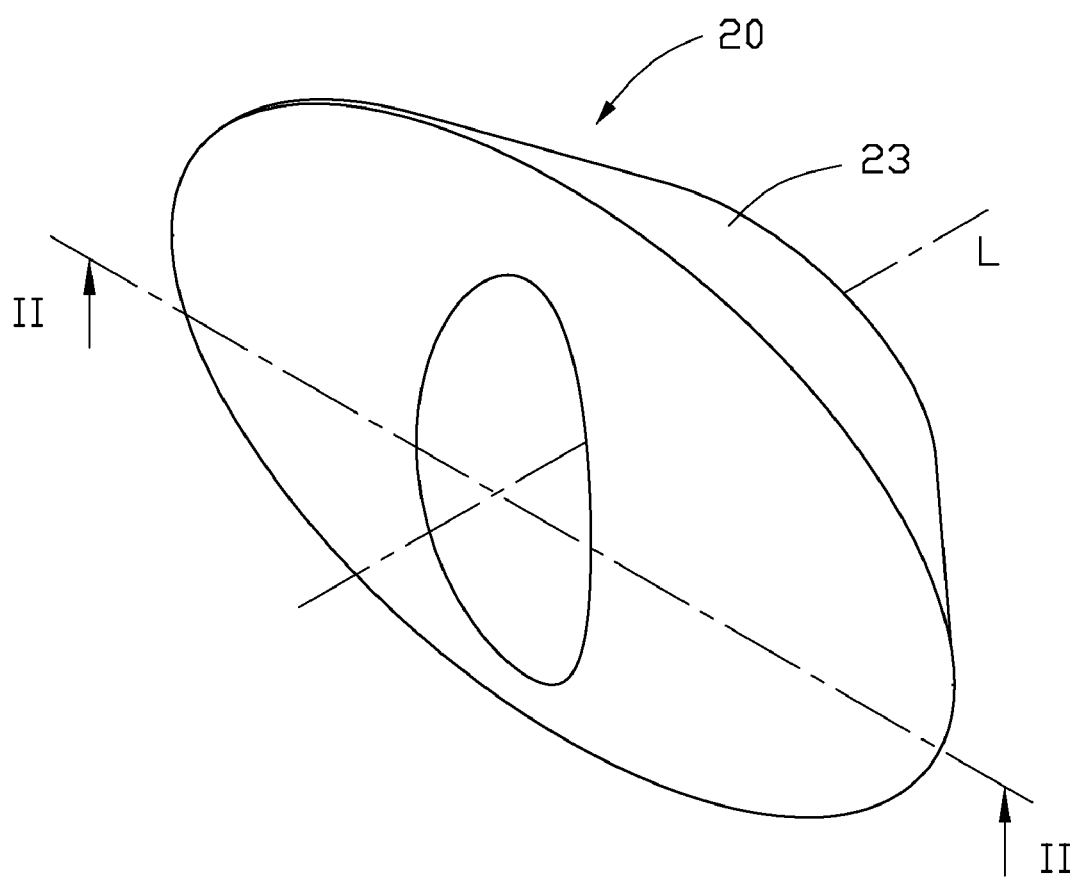
FIG. 1 is a schematic isometric view of an LED light source, according to an exemplary embodiment.
Figure 2:
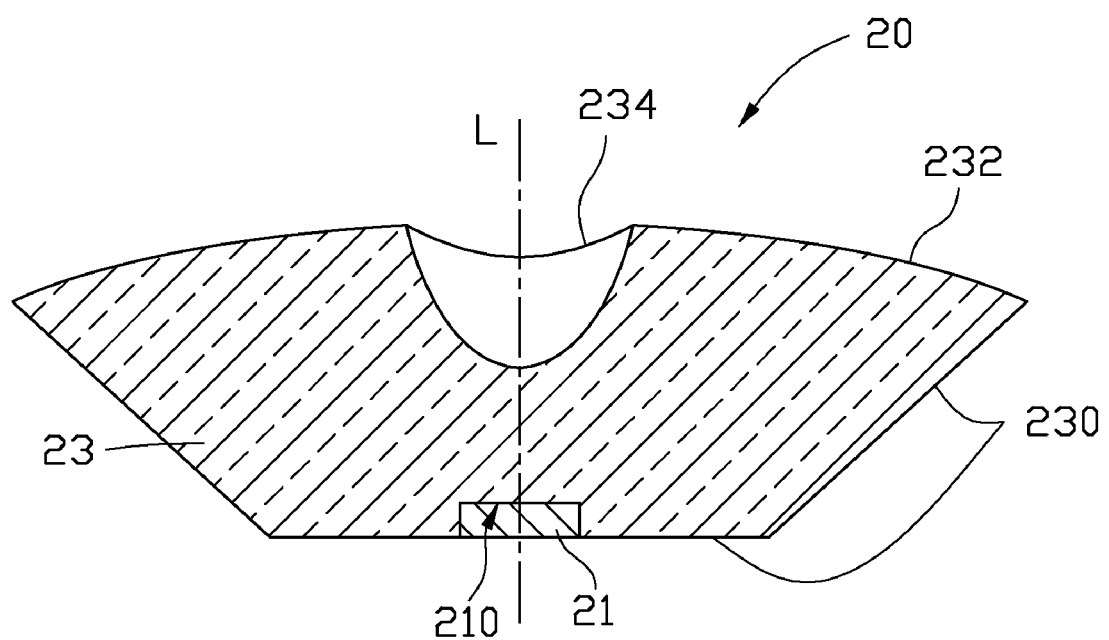
FIG. 2 is a cross-sectional view taken from line II-II of FIG. 1.

Referring to FIGS. 1-2, an LED light source 20, according to an exemplary embodiment, includes an LED die 21 and a transparent encapsulation 23. The LED die 21 includes a die emitting surface 210. The transparent encapsulation 23 includes a reflective surface 230 and an encapsulation emitting surface 232. The LED die 21 is encapsulated by the transparent encapsulation 23 such that the die emitting surface 210 faces the encapsulation emitting surface 232. That is, the transparent encapsulation 23 is a solid body of material that contacts the LED die 21. The transparent encapsulation 23 defines a concave recess (not labeled), thereby defining a recessed portion 234 of the encapsulation emitting surface 232. The recessed portion 234 is aligned with the die emitting surface 210, and is shaped so as to increase the effect of TIR of light rays incident thereon.

The transparent encapsulation 23 can be in any suitable shape which efficiently disperses light rays from the LED die 21, for example, a dome. In this embodiment, the transparent encapsulation 23 is generally in the form of a frustum of a cone. In particular, the transparent encapsulation 23 has an ellipse bottom surface, a generally convex upper surface, a side surface connecting the bottom surface and the upper surface, and an axis of symmetry L passing through the centers of the bottom surface and the convex upper surface. The ellipse bottom surface and the side surface cooperatively function as the reflective surface 230, and the convex upper surface (including the recessed portion 234) functions as the encapsulation emitting surface 232. The LED die 21 is positioned such that the axis L is substantially perpendicular to the die emitting surface 210 and passes through the center of the die emitting surface 210.

The transparent encapsulation 23 is made from plastic, such as polymethyl methacrylate (PMMA), polycarbonate (PC), or silicone. In other alternative embodiments, the transparent encapsulation 23 can be made from glass.

The recessed portion 234 is generally convex-shaped. The axis L passes through the center of the recessed portion 234. As such, the recessed portion 234 can efficiently increase the effect of TIR of light rays incident thereon, to improve light uniformity of the encapsulation emitting surface 232.

Figure 4:
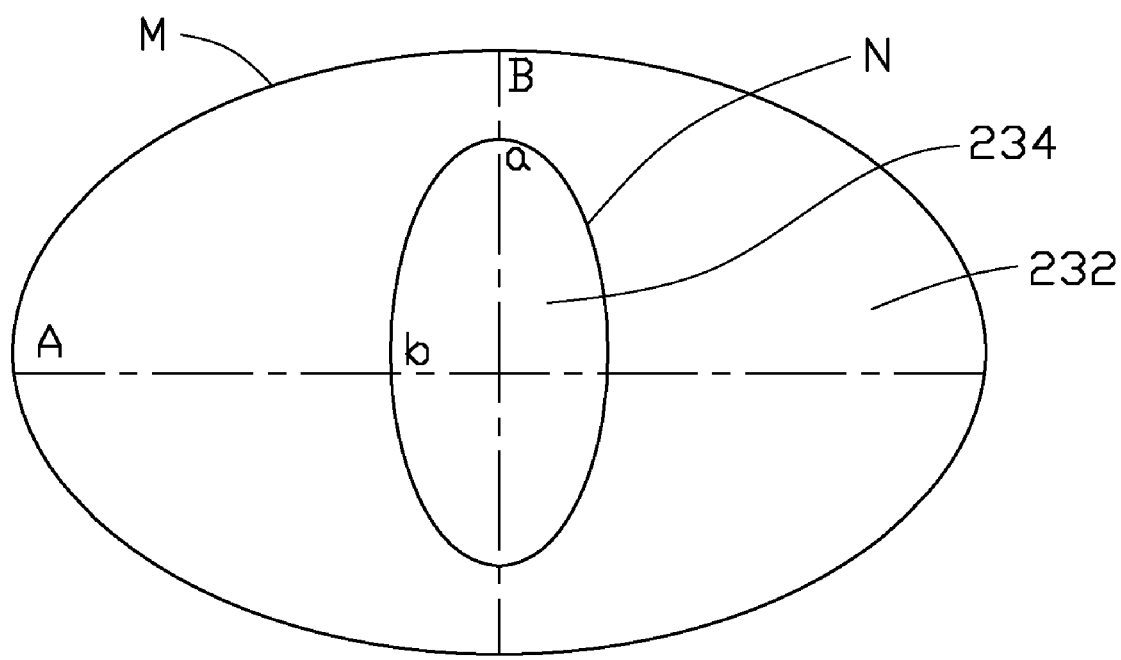
FIG. 4 is a schematic plan view of the LED light source of FIG. 1.

More detailedly, referring to FIG. 4, a first contour M of an orthogonal projection of the encapsulation emitting surface 232 onto a plane corresponding to the ellipse bottom surface and a second contour N of an orthogonal projection of the recessed portion 234 onto the ellipse bottom surface are both ellipses in shape, and are concentric with each other on the axis L. A major axis A of the first contour M coincides with a minor axis "b" of the second contour N. A minor axis B of the first contour M coincides with a major axis "a" of the second contour N. As such, the light uniformity of the encapsulation emitting surface 232 is further improved.

Figure 3:
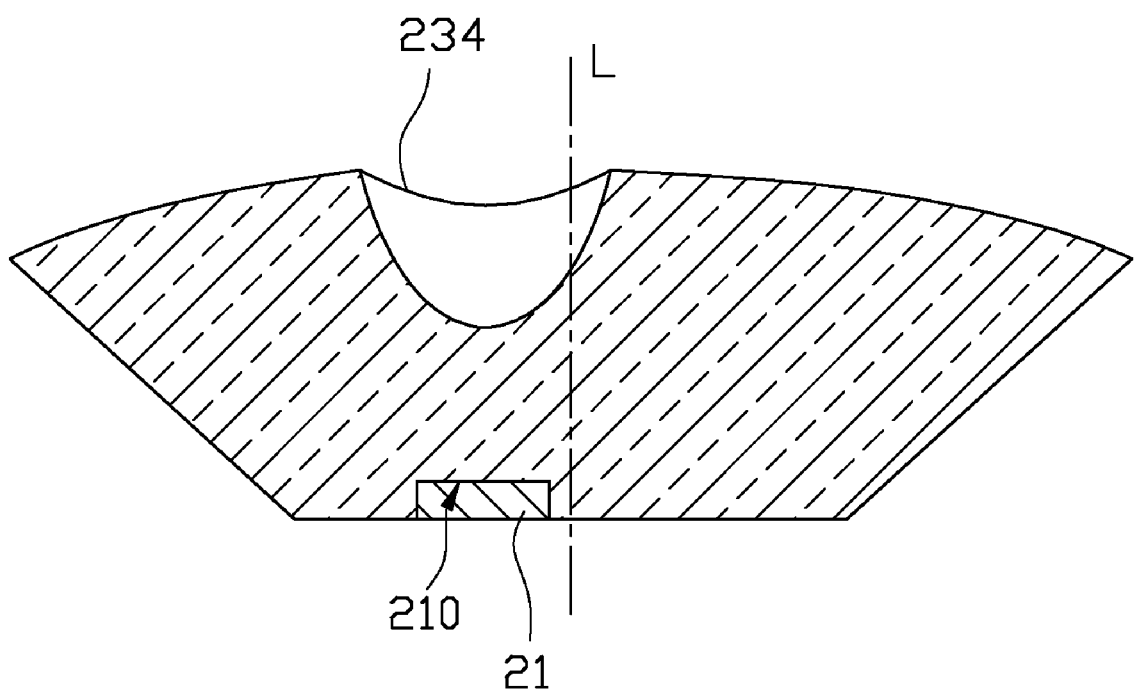
FIG. 3 is a cross-sectional view of an LED light source, according to another embodiment.

It should be mentioned that, as seen in FIG. 2, a cross-section of the recessed portion 234 taken along a plane coinciding with the minor axis "b" of the second contour N defines a line in the shape of part of an ellipse. In addition, in the present embodiment, a center of the LED die 21 is aligned with the axis L. However, referring to FIG. 3, in an alternative embodiment, the center of the LED die 21 can deviate from the axis L. In such a case, the recessed portion 234 can correspondingly deviate from the axis L too.

Figure 5:
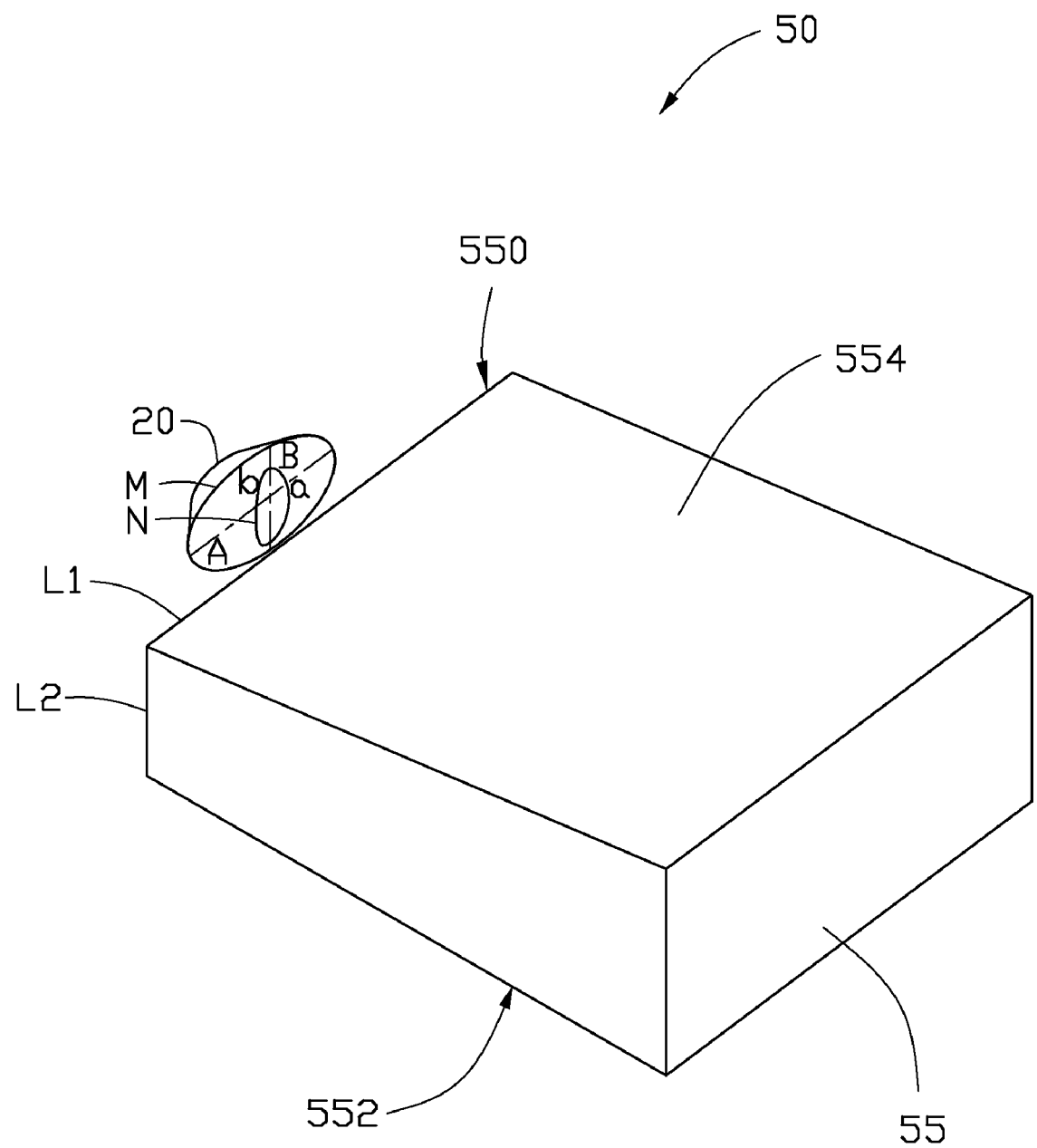
FIG. 5 is a schematic isometric view of a backlight, according to further another exemplary embodiment.

Referring to FIG. 5, a backlight 50, according to another embodiment, includes the LED light source 20 and a light guide 55.

The light guide 55 is substantially a wedge in shape, and includes an incident surface 550, a bottom surface 552 adjacent to the incident surface 550, and a top emitting surface 554. The incident surface 550 is rectangular, and has two long edges L1 and two short edges L2.

The LED light source 20 is placed in front of the incident surface 550. The encapsulation emitting surface 232 faces the incident surface 550. The major axis A of the first contour M and the minor axis "b" of the second contour N are substantially parallel to the two long edges L1. The minor axis B of the first contour M and the major axis "a" of the second contour N are substantially parallel to the two short edges L2.

While various exemplary and preferred embodiments have been described, it is to be understood that the invention is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A light emitting diode light source comprising:
a light emitting diode die comprising a die emitting surface; and
a transparent encapsulation comprising:
an encapsulation emitting surface, and
a reflective surface comprising an ellipse bottom surface and a side surface connecting the ellipse bottom surface and the encapsulation emitting surface
the light emitting diode die being encapsulated by the transparent encapsulation such that the die emitting surface faces the encapsulation emitting surface, the encapsulation emitting surface being generally convex and having a concave recessed portion, wherein the transparent encapsulation defines an axis of symmetry passing through the centers of the ellipse bottom surface and the encapsulation emitting surface, the light emitting diode die is positioned such that the axis is substantially perpendicular to the die emitting surface and substantially passes through the center of the die emitting surface and the center of the recessed portion, a first contour of an orthogonal projection of the encapsulation emitting surface onto a plane corresponding to the ellipse bottom surface is an ellipse in shape, a second contour of an orthogonal projection of the recessed portion onto the ellipse bottom surface is an ellipse in shape a major axis of the first contour coincides with a minor axis of the second contour, a minor axis of the first contour coincides with a major axis of the second contour, a cross-section of the recessed portion taken along a plane coinciding with the minor axis of the second contour defines a line in the shape of part of an ellipse, and the recessed portion is configured to increase an effect of total internal reflection of light rays generated by the light emitting diode die and incident on the encapsulation emitting surface.

2. The light emitting diode light source of claim 1, wherein the transparent encapsulation is a solid body of material that contacts the light emitting diode die.

3. The light emitting diode light source of claim 1, wherein the transparent encapsulation is made from material selected from the group consisting of plastic and glass.

4. The light emitting diode light source of claim 1, wherein the transparent encapsulation is made from material selected from the group consisting of polymethyl methacrylate, polycarbonate, and silicone.

* * * * *